Figure 1:
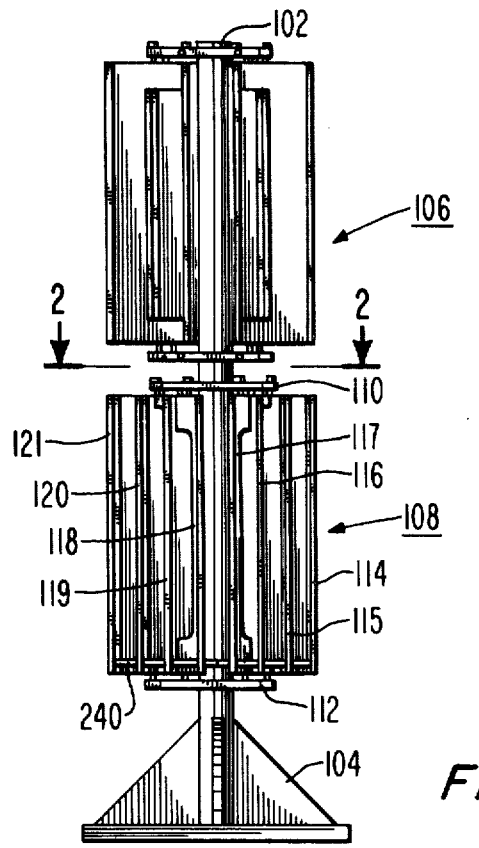

United States Patent [19]

Herman

[11] 4,301,495
[45] Nov. 17, 1981

[54] PRINTED CIRCUIT BOARD SUPPORT STRUCTURE

[75] Inventor: Ralph Herman, Cherry Hill, N.J.

[73] Assignee: RCA Corporation, New York, N.Y.

[21] Appl. No.: 125,117

[22] Filed: Feb. 27, 1980

[51] Int. Cl.³ .......................................... H05K 05/02
[52] U.S. Cl. .................................... 361/415; 361/391
[58] Field of Search ................................ 361/391, 415

[56] References Cited
U.S. PATENT DOCUMENTS

| | | |
|---|---|---|
| 244,406 | 7/1881 | Swartz . |
| 3,129,991 | 4/1964 | Schmitz ........................ 361/391 X |
| 3,188,524 | 6/1965 | Williams ....................... 361/415 X |
| 3,683,238 | 8/1972 | Olds .............................. 361/415 X |
| 3,689,128 | 9/1972 | Andreini ....................... 361/415 X |
| 3,755,716 | 8/1973 | Yoshii ........................... 361/391 X |
| 3,992,654 | 11/1976 | Springer ............................ 361/415 |

FOREIGN PATENT DOCUMENTS 1004011 9/1965 United Kingdom ............... 361/415

OTHER PUBLICATIONS

R. L. Cimijotti, Hinged Mounting For Circuit Boards, IBM Tech. Disc. Bull., vol. 19 #1, Jun. 1976, p. 250.

*Primary Examiner*—Richard R. Kucia
*Attorney, Agent, or Firm*—Samuel Cohen; William Squire

[57] ABSTRACT

A printed circuit board support structure for supporting a number of printed circuit boards in a vertical spaced orientation while permitting access to either side of any selected circuit board includes a central, vertically oriented, support post and a plurality of pivotally mounted printed circuit support frames which extend from the post. A structure is provided to rotate each frame about the axis of the post from its initial position to at least a second position at right angles thereto with the printed circuit board in a vertical orientation in both positions of the frames.

4 Claims, 12 Drawing Figures

PRINTED CIRCUIT BOARD SUPPORT STRUCTURE

The present invention relates to a support structure for supporting printed circuit boards during testing.

Modern electronic systems are often made up of a number of printed circuit boards, each carrying a large number of, such as 500 or more, integrated circuit packages. A system may include as many as 10 or more such printed circuit boards, which are interconnected. During engineering development and research it is desired to provide power to such printed circuit boards, while interconnected, for performing tests on the system. Such tests require access by a technician to either side of any one of the printed circuit boards. Such printed circuit boards should also be cooled while operated and yet be readily accessible on either side.

Known mounting structures for printed circuit boards may be fixed rack configurations, that is, structures having a housing within which there are guides mounted in fixed relation to each other. Sometimes the systems are mounted in drawers, similar to file drawers, which may be slid in and out of a cabinet. However, if, as desired, the printed circuit boards in each drawer are closely mounted to each other in the interest of saving space, they cannot easily be accessed for testing and servicing.

In accordance with an embodiment of the present invention, a printed circuit board support structure which selectively provides access to each side of any selected one of a plurality of printed circuit boards includes support means and a plurality of printed circuit board receiving means for receiving and releaseably securing printed circuit boards thereto. Means are included for selectively moveably securing each receiving means to the support means and for positioning the receiving means in a first parallel spaced array in one orientation so that the planes of the received printed circuit boards are vertical and a second spaced parallel array in a second orientation orthogonal to the first orientation with the planes remaining vertical.

Figure 2:
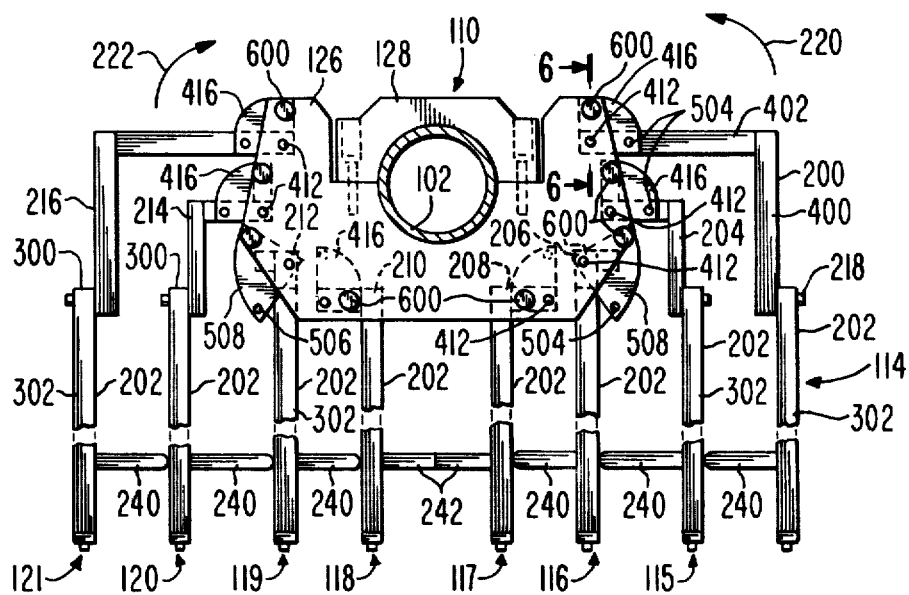
Figure 3:
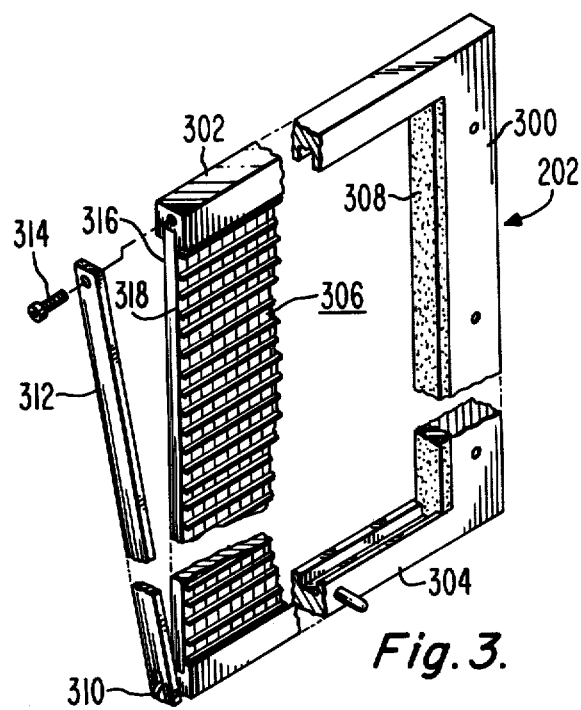
Figure 4B:
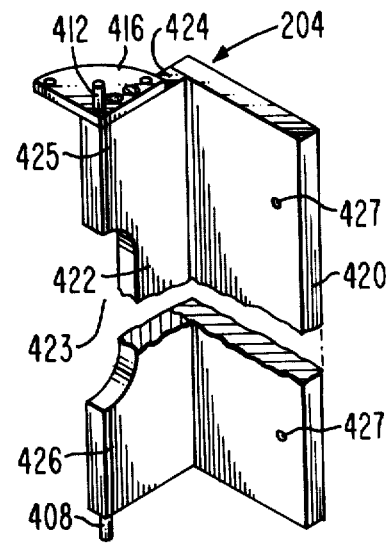
Figure 4C:
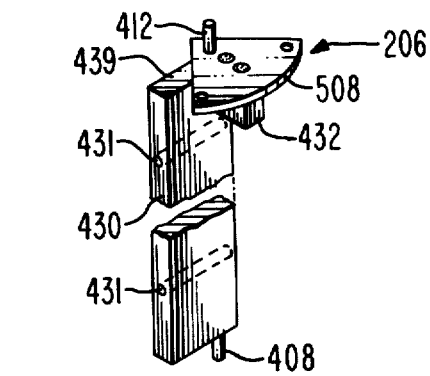
Figure 4A:
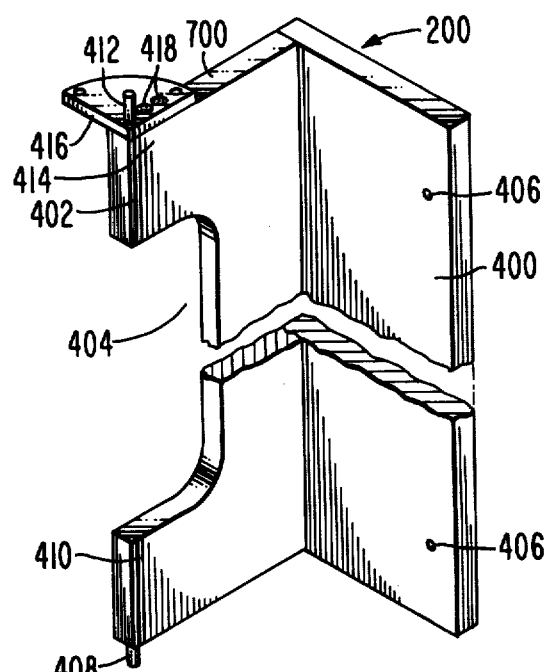
Figure 5A:
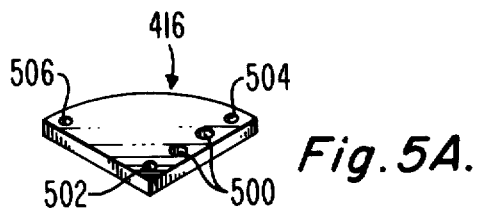
Figure 5B:
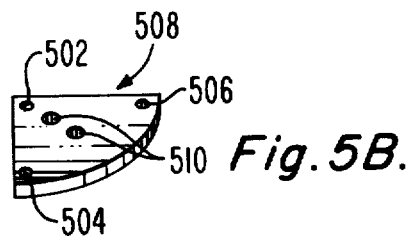
Figure 6:
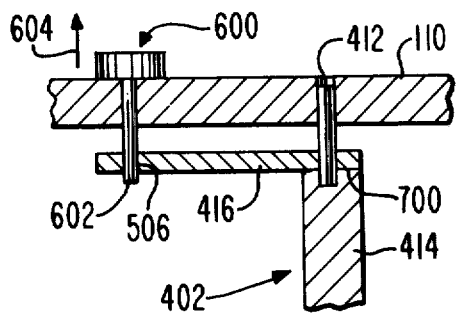
Figure 7:
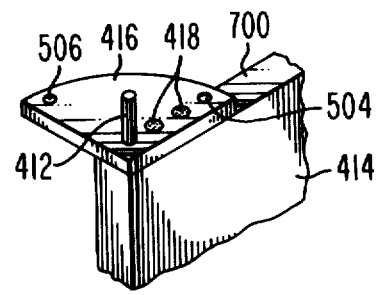
Figure 8:
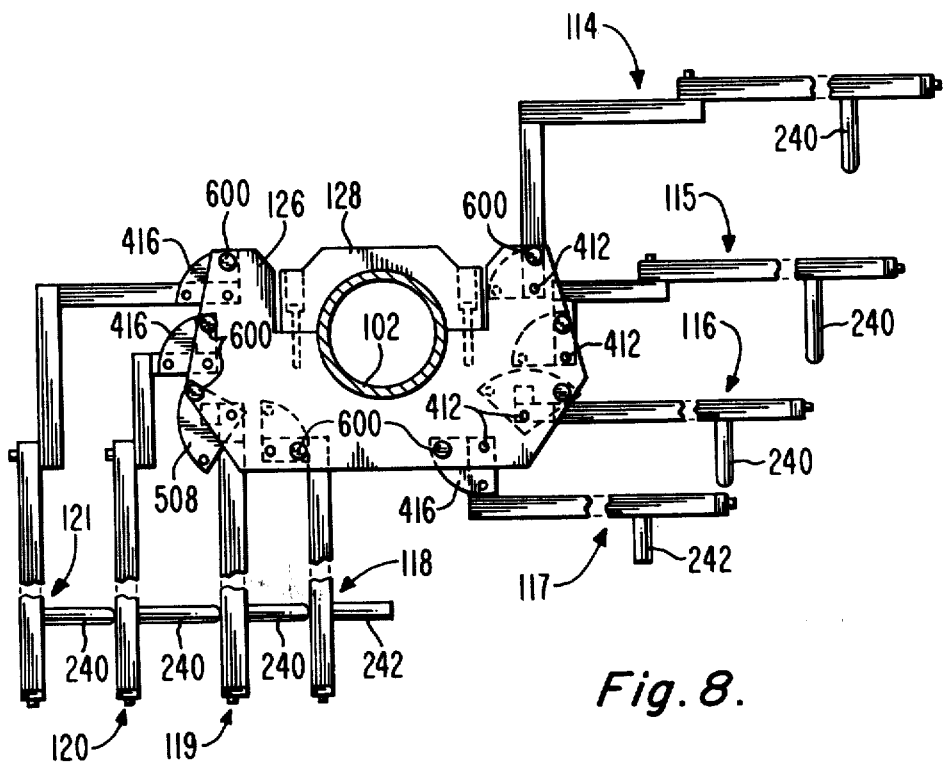

In the drawing:

FIG. 1 is a side elevation view of a printed circuit board support structure embodying the present invention, FIG. 2 is a sectional plan view of the structure of FIG. 1 taken along lines 2—2, FIG. 3 is an isometric view of a printed circuit board frame construction which is used to hold the printed circuit boards in the structure of FIG. 1, FIGS. 4A, B, C, and D are isometric views of different mounting brackets attached to the frame structure of FIG. 3 for securing frame structures to the central support, FIGS. 5A and 5B are isometric views of detent structures used in the embodiment of FIG. 1, FIG. 6 is a sectional view taken along lines 606 of FIG. 2, FIG. 7 is an isometric view of the hinge detent plate and mounting bracket construction of FIG. 4A, and FIG. 8 is a sectional plan view similar to the view of FIG. 2 illustrating a different position for some of the mounted printed circuit boards.

In FIG. 1 a vertical cylindrical post 102 is mounted to a base 104. Secured to the post 102 are identical printed circuit mounting structures 106 and 108 wherein structure 106 is mounted directly above the structure 108 but is rotated 180° about post 102 relative to 108. The structure 106 being identical to structure 108, only the structure of 108 will be described below. While two structures 106 and 108 are shown, fewer or larger number of structures may be mounted to a post such as post 102 for a given implementation.

The structure 108 is secured to the post 102 by two parallel clamp assemblies 110 and 112. Printed circuit board mounting frame and supporting bracket assemblies 114-121 are hinged to the clamp assemblies 110 and 112.

In FIG. 2 frame assembly 114 includes a mounting bracket 200 to which is fastened frame assembly 202. The frame assemblies 202 used to mount the printed circuit boards are identical throughout the structure. This frame assembly will be described below in detail with respect to FIG. 3. Frame assembly 202 of bracket assemblies 115-121 are respectively secured to brackets 204-216. The brackets in each of bracket pairs 200, 216; 204, 214; 206, 212; and 208, 210 are mirror images of each other and identical otherwise.

In FIG. 3 a typical frame assembly 202 comprises a vertical member 300, an upper horizontal channel member 302 and a lower horizontal channel member 304. Channel members 302 and 304 are secured perpendicular to the member 300 for receiving a printed circuit board 306. Cemented to the inner surface of the vertical member 300 is an insulating foam rubber strip 308 which electrically insulates any of the electrodes of the printed circuit board 306 from making contact with the member 300 which, preferably, is made of metal.

The extended end of member 304 has a hinge 310 to which is pivotally mounted bracket 312 which can be screwed to the extended end of member 302 by screw 314. Bracket 312 locks the printed circuit board 306 to the frame 202. Both sides of the printed circuit board at 316 and 318 are exposed to the ambient by the frame assembly 202.

FIG. 4A illustrates the mounting bracket 200 which secures the frame assembly 202 to the clamp assemblies 110 and 112. Bracket 200 is an L-shaped member having a rectangular upstanding member 400 which is screwed or welded at a right angle to upstanding member 402. Member 402 includes a cutout area 404 which permits harness cables and other electrical wiring to be connected to the printed circuit board. The member 400 has a plurality of spaced threaded apertures 406 to which the frame 202 is to be secured by screws 218 (FIG. 2). Lower hinge pin 408 depends from the extended region of leg 410. Upper hinge pin 412 is secured to leg 414 at its extended region and passed through detent plate 416. Detent plate 416 is a quarter circular segment steel plate which is screwed flush to the upper surface 700 of leg 414 by screws 418.

Detent plate 416 in FIG. 5A includes two screw receiving apertures 500, a hinge pin receiving aperture 502 and two detent apertures 504 and 506. A line through the hinge aperture 502 and detent aperture 504 is perpendicular to a line through the apertures 502 and 506. FIG. 7 illustrates the mounting of detent plate 416 to the leg 414 from a different view. The detent plate 416 is mounted flush against the upper surface 700 of the leg 414. The plane of the hinge plate 416 is perpendicular to an axis formed by hinge pins 408 and 412 aligned vertically along a common axis.

In FIG. 6 bracket member 402 is shown mounted to the clamp assembly 110. Detent knob 600 is secured to the assembly 110 so that its pin 602 fits within the aperture 504 or 506 of the detent plate 416 in accordance with the desired orientation of the member 402. The detent knob 600 can be raised in the direction 604 to release it from the aperture 506. When the detent pin 602 engages with the detent apertures 504 and 506 of plate 416, the mounting bracket 200 assumes one of two othogonal orientations as will be described later.

The mounting bracket 204, FIG. 4B, comprises an upstanding leg 420 and a second leg 422 which is perpendicular to leg 420. Leg 422 also includes a cutout 423 whose purpose is similar to that of cutout 404 of bracket 200. Secured to the upper surface 424 of leg 422 is a second detent plate 416. Hinge pin 412 is secured to the extended region of leg 425. Mounted to the extended region of lower leg 426 of member 422 is hinge pin 408. Pins 412 and 408 are aligned along a common hinge axis. A frame 202 is secured to bracket 204 at threaded apertures 427 as shown in FIG. 2.

Mounting bracket 206, FIG. 4C, comprises an elongated member 430 and a leg 432 which is mounted at right angles to member 430. Detent plate 508 is mounted to the coplanar upper surfaces 439 of member 430 and leg 432. Plate 508 is shown in more detail in FIG. 5B. Plate 508 comprises a hinge aperture 502 and two detent apertures 504 and 506. The detent apertures 504 and 506 in all the detent plates 416 and 508 are identical in orientation with respect to the hinge aperture 502 and in diameter. The plates 508 and 416 are all of the same thickness. Two screw apertures 510 are aligned with the hinge aperture 502 along a line intermediate the radial lines through the detent apertures 504 and 506. Hinge pins 412 and 408 are secured to opposite respective ends of member 430. Threaded apertures 431 secure a frame assembly 202 to the member 30. The hinge axis for the mounting bracket 206 is aligned with member 430.

Figure 4D:
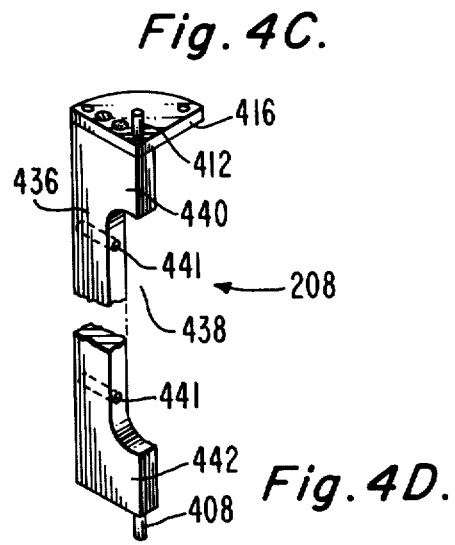

In FIG. 4D, mounting bracket 208 comprises member 436 having a cutout area 438 which forms upper and lower legs 440 and 442, respectively. Hinge pins 412 and 408 extend in opposite directions from the extended regions of legs 440 and 442, respectively, along a common hinge axis. Detent plate 416 is screwed to the upper surface of leg 440. The hinge axis for bracket 208 is formed by pins 412 and 408. A frame assembly 202 is secured to member 438 at threaded apertures 441.

In FIGS. 5A and 5B, the detent plates 416 and 508 are used repeatedly throughout the structure of FIG. 1. Similarly, the mounting brackets 200, 204, 206 and 208 of FIGS. 4A, B, C and D are used throughout the assembly of FIG. 1.

In FIG. 2 the mounting brackets 200, 204, 206 and 208 are mirror images of the brackets 216, 214, 212 and 210, respectively, forming two sets of brackets mounted on opposite halves of the clamp assemblies 110 and 112. Frame assemblies 202 are mounted to the mounting brackets as shown in FIG. 2. Thus, the frame and mounting bracket assemblies 200, 204, 206 and 208 form a first set while the assemblies 202 and mounting brackets 210, 212, 214 and 216 form a second set of assemblies.

The first set rotates in the counter-clockwise direction 220 from the position shown, while the second set rotates in a clockwise direction 222 from the position shown. The first set of assemblies is rotated in direction 220 until the detent aperture 504 of each of the detent plates is aligned with the corresponding detent pin 602 (see FIG. 6). When so aligned the detent pin 602 of knob 600 slips into the detent aperture locking that bracket and frame assembly in a second orientation as illustrated in FIG. 8. Each of the mounting frame and support bracket assemblies 114–117 is rotated about its respective hinge until the set of assemblies is in the position of FIG. 8 which is 90° from the position of FIG. 2. Assemblies 118–121 are rotated in directions 222 in the opposite direction about their respective hinge axes until they are in a mirror image position with respect to the assemblies 114–117 of FIG. 8.

To insure that none of the printed circuit board components on the circuit board 306 touch components on adjacent circuit boards, each of the frame assemblies 202 include bumpers 240 or 242, FIG. 2, to provide spaced positioning between adjacent frames. Preferably the bumpers are several inches in length. In FIG. 2 bumpers 240 and 242 are attached to the frame members 304. Bumpers 240 are identical and may be formed of hard rubber or other suitable insulating material. The bumpers 242 are identical to each other and are shorter than bumpers 240. One bumper 242 is mounted on the frame member 304 of bracket assembly 117 while the other bumper 242 is mounted on the frame member 304 of bracket assembly 118.

The clamp assemblies 110 and 112, FIG. 2, are identical with the exception of the presence of the detent knob 600 which is present only on the upper clamp assembly 110. Clamp assembly 110 comprises a clamp plate 126 which is secured to post 102 by a clamp 128. The hinge axes formed by the two clamp assemblies 110 and 112 are located so that all of the mounting frame and support bracket assemblies are parallel in one orientation as shown in FIG. 2 and parallel in a second orientation as illustrated by the assemblies 114–117 of FIG. 8. Also, when in the orientation of FIG. 2, the edges of all the frame assemblies preferably terminate in a common plane as shown for compactness.

In operation, various printed circuit board assemblies which may be several square feet in area are secured to the frame assemblies 202. These frame assemblies may be a few feet on a side and rectangular in shape. These printed circuit boards, therefore, are relatively large and include a large number of integrated circuit and other circuit components mounted thereon as discussed above. Each of these circuit boards can be interconnected by cabling (not shown) for operation of all the printed circuit boards so mounted as a system. Bumpers 240 and 242 may separate the circuit boards by several inches allowing sufficient air flow between the circuit boards to provide natural convection cooling of the system during operation. Thus, no blowers or external cooling apparatus need be provided. Each circuit board and its mounting frame may be rotated from the position of FIG. 2 in directions 220 or 222 in accordance with the position on the assembly. An operator has access to either side of any circuit board as he so chooses during the operation of the circuit board in the system. For example, if the operator wishes to test the left side of a circuit board mounted to the assembly 115 of FIG. 2, he rotates assemblies 115 and 114 in the direction 220 until positioned as shown in FIG. 8. Assemblies 117 and 116 remain as shown in FIG. 2 The operator then has access to one side of the circuit board on assembly 115. Should the operator wish to access the other side of this circuit board, the circuit board is rotated with its mounting assembly in the direction 222 until it is oriented as shown in FIG. 2. This exposes the opposite side. In this manner, each and every circuit board and its assembly can be oriented as desired for easy access during test.

The assembly 106 of FIG. 1, which is identical to the assembly 108 just described, is as discussed above mounted directly above the assembly 108 and facing in a 180° opposite orientation as that shown in FIG. 2. In this spaced relationship one operator may operate on the assembly 106 and a second operator may operate on the assembly 108. In this way when the frame assemblies of the assembly 106 are secured parallel to those of the assembly 108 as shown in FIG. 2, all of the circuit boards are mounted parallel to those of FIG. 2, but with the circuit board frames of the assembly 106 facing in 180° opposite direction than the circuit board frames of those of the lower assembly. Relatively few different parts are required for the entire structure. For example, only two different kinds of detent plates are required as shown in FIG. 5A and 5B. The detent plates used on each half of the lower assembly of FIG. 2 are identical but oriented in a 180° mirror image orientation. Circuit boards are readily assembled to the frame assemblies 202 of FIG. 3 by unlocking the locking member 312 and rotating it out of the way.

The orientation of the mounting frame and support bracket assemblies of FIG. 8 is just one example of many different possible orientations of the various support bracket assemblies on the structure. What is important is that when all of the bracket assemblies are oriented as shown in FIG. 2, they provide a neat, compact arrangement which utilizes very little floor space. When the assemblies are oriented as shown in FIG. 8, the amount of floor space utilized is still small.

What is claimed is:

1. A printed circuit board support structure comprising:
   an upstanding post,
   first and second clamp members secured in spaced relation to said post,
   a plurality of like printed circuit board receiving frames,
   a like plurality of frame connecting means for rotatably securing each said frame vertical to said clamp members,
   detent plate means secured to each said connecting means, and
   detent means on at least one of said clamp members mating with said plate means for selectively positioning said frame means in each of two vertical orthogonal positions.

2. The structure of claim 1 wherein said detent plate means include means for orienting each said frames parallel and vertical in said two orthogonal positions.

3. The structure of claim 1 further including a locking frame member hinged to each frame for locking the received printed circuit board to that frame.

4. The structure of claim 1 wherein said connecting means includes a plurality of L-shaped bracket means forming a first set, each means being secured to a frame at one leg of the L, each bracket means being hinged to said clamp members, the hinge axis of each bracket means being spaced a distance normal to the plane of said frames different than that of the remaining bracket means.

* * * * *